United States Patent
You et al.

(10) Patent No.: US 12,137,577 B2
(45) Date of Patent: Nov. 5, 2024

(54) DISPLAY DEVICE COMPRISING DIFFRACTION LAYER AND REFRACTION PATTERN FOR CONTROLLING VIEWING ANGLE

(71) Applicant: Samsung Display Co., Ltd., Yongin-Si (KR)

(72) Inventors: Jaeho You, Gwangmyeong-si (KR); Hyun Jin Cho, Seoul (KR); Beomshik Kim, Seoul (KR); Youngchan Kim, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 17/501,995

(22) Filed: Oct. 14, 2021

(65) Prior Publication Data
US 2022/0223824 A1    Jul. 14, 2022

(30) Foreign Application Priority Data

Jan. 11, 2021    (KR) .......................... 10-2021-0003423

(51) Int. Cl.
*H10K 50/858*    (2023.01)
(52) U.S. Cl.
CPC .................................. *H10K 50/858* (2023.02)
(58) Field of Classification Search
CPC ........................... H10K 50/858; H10K 59/879
See application file for complete search history.

(56) References Cited

U.S. PATENT DOCUMENTS

| 8,503,122 | B2 | 8/2013 | Liu et al. |
| 8,619,363 | B1 | 12/2013 | Coleman |
| 2018/0122292 | A1* | 5/2018 | Ju ........................ G02B 3/005 |
| 2019/0025571 | A1* | 1/2019 | Lee ................... G02F 1/133524 |

FOREIGN PATENT DOCUMENTS

| KR | 10-2018-0021597 A | 3/2018 |
| KR | 10-2018-0047275 A | 5/2018 |
| KR | 10-2019-0011372 A | 2/2019 |
| KR | 10-2019-0141928 A | 12/2019 |

\* cited by examiner

*Primary Examiner* — Daniel Whalen
(74) *Attorney, Agent, or Firm* — Innovation Counsel LLP

(57) ABSTRACT

A display device includes a substrate, a first set of light emitting structures, a second set of light emitting structures, a diffraction layer, and a refraction pattern. The substrate includes a first region and a second region. The first set of light emitting structures overlaps the first region. The second set of light emitting structures overlaps the second region. The diffraction layer overlaps the first region without overlapping the second region. The refraction pattern overlaps the diffraction layer. The diffraction layer includes first-refractive-index members and second-refractive-index members that are alternately disposed. A refractive index of each of the first-refractive-index members is lower than a refractive index of each of the second-refractive-index members.

18 Claims, 7 Drawing Sheets

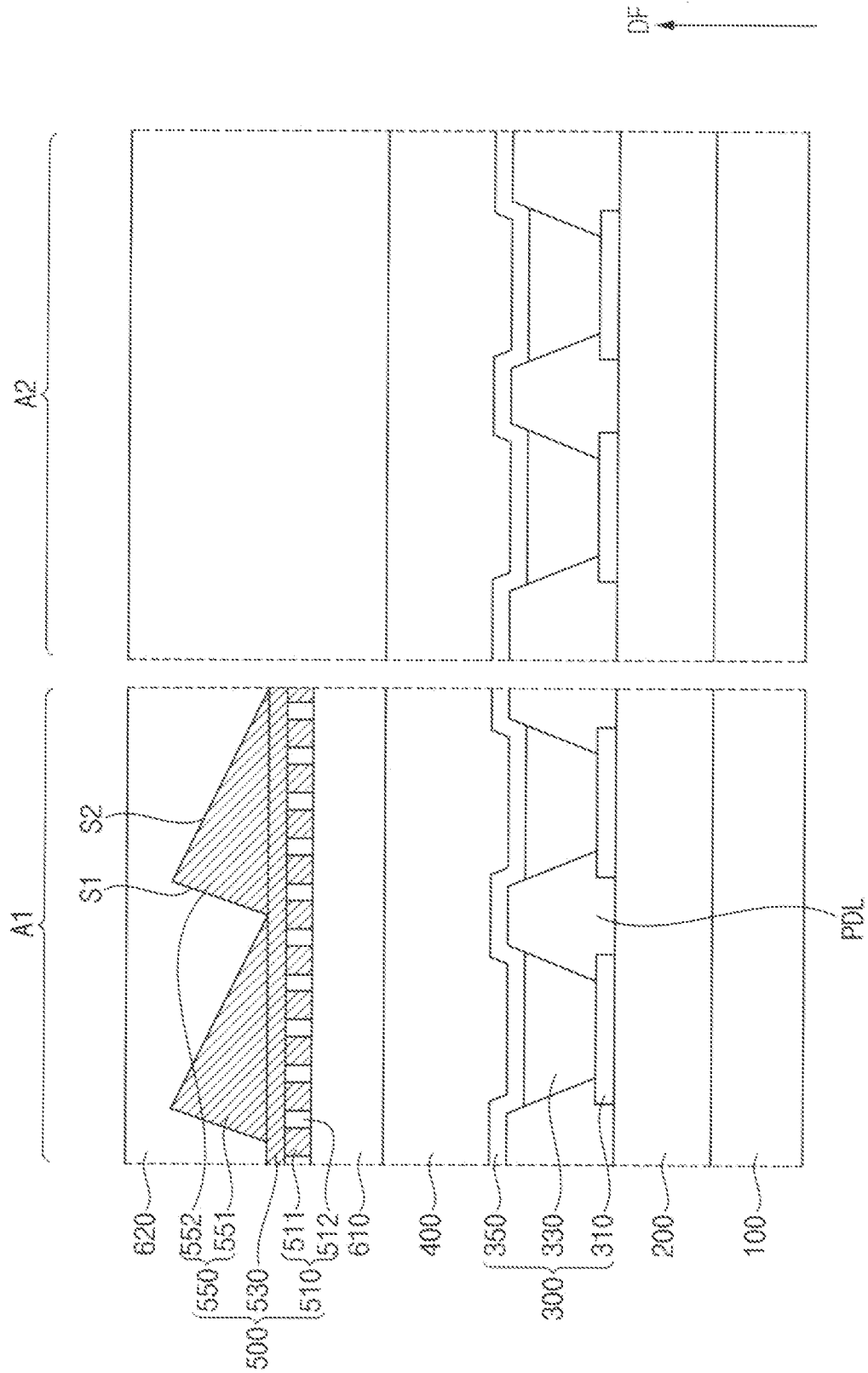

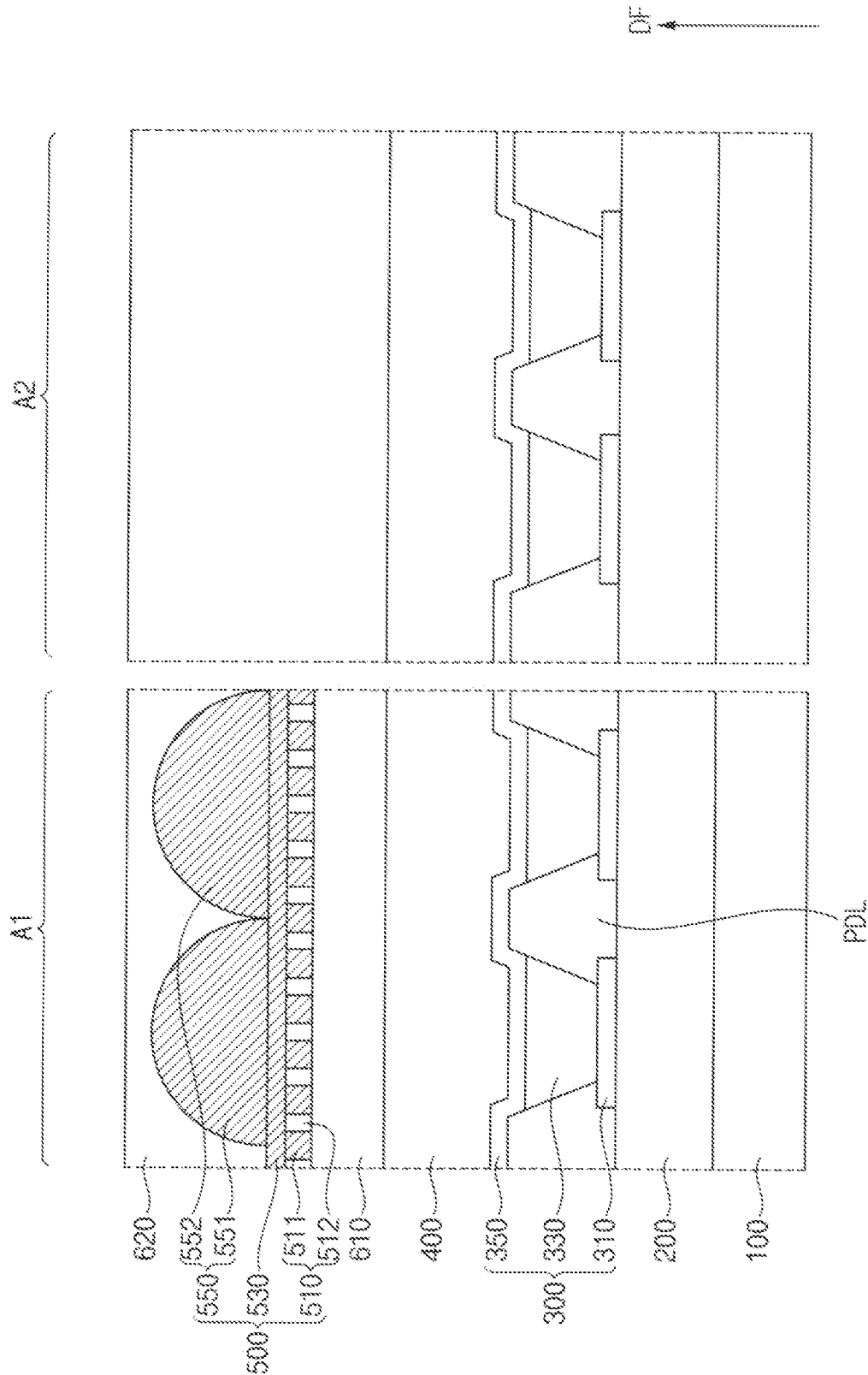

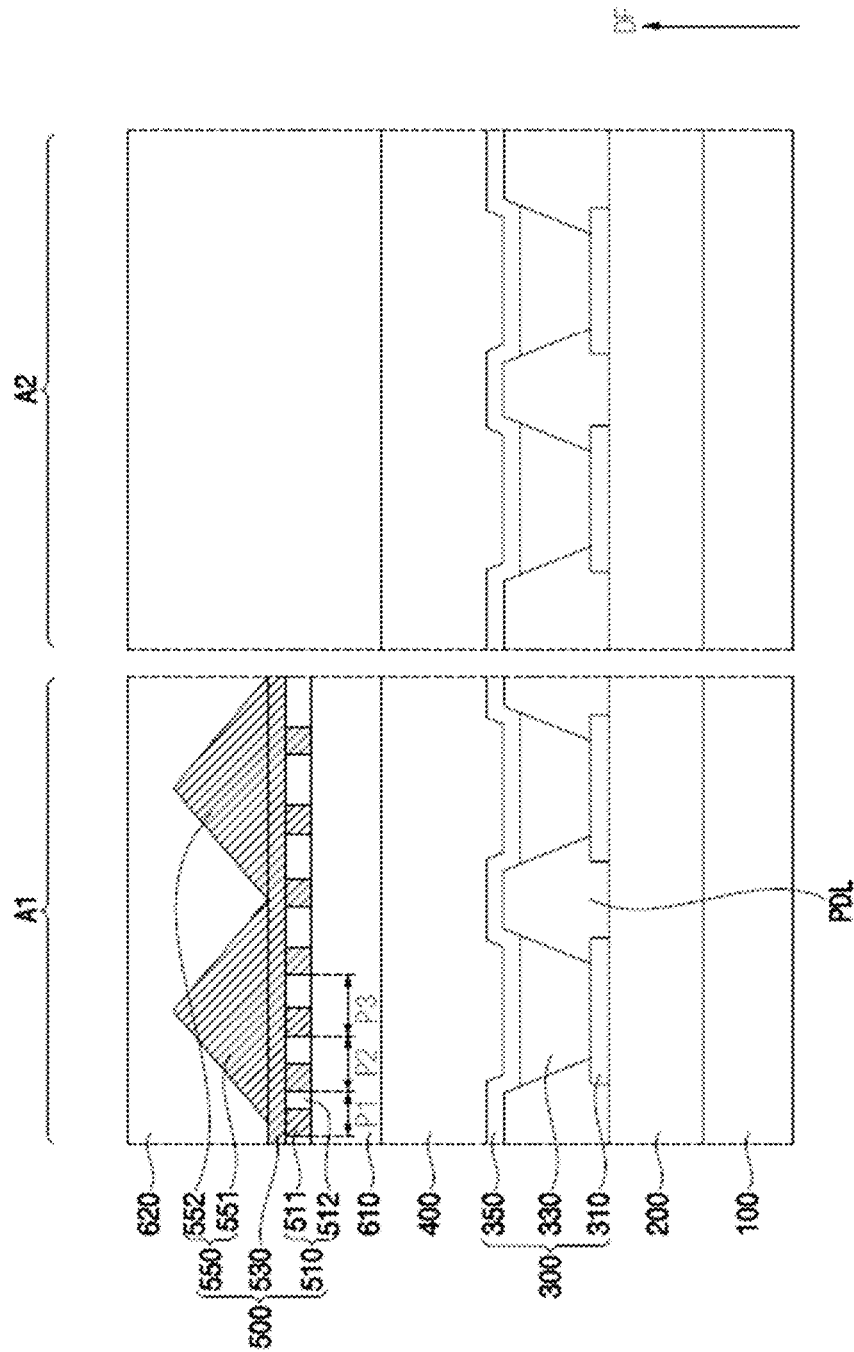

DISPLAY DEVICE COMPRISING DIFFRACTION LAYER AND REFRACTION PATTERN FOR CONTROLLING VIEWING ANGLE

CROSS-REFERENCE TO RELATED APPLICATION(S)

This application claims priority to and the benefit of Korean Patent Application No. 10-2021-0003423, filed on Jan. 11, 2021; the Korean Patent Application is incorporated by reference.

BACKGROUND

1. Field

The technical field relates to a display device.

2. Discussion of the Background

A display device may display images according to input signals. Modern display devices include liquid crystal display devices, organic light emitting display devices, and plasma display devices.

A display device may display an image to be viewed by multiple users at the same time. Accordingly, the display device is required to display the image with a wide viewing angle.

A display device may be used in a public space. For example, a display device of a mobile phone may be used in public transportation, and a display device of an automatic teller machine may be located outside a bank. In order to protect private information, the user of the display device may need to at least partially block a displayed image from being viewed by others.

The Background section is for understanding of the background of the patent application. The Background section may contain information that does not constitute prior art.

SUMMARY

Some embodiments may be related to a display device capable of selectively controlling a viewing angle.

An embodiment may be related to a display device. The display device may include a substrate, a first set of light emitting structures, a second set of light emitting structures, a diffraction layer, and a refraction pattern. The substrate may include a first region and a second region. The first set of light emitting structures may overlap the first region. The second set of light emitting structures may overlap the second region. The diffraction layer may overlap the first region without overlapping the second region. The refraction pattern may overlap the diffraction layer. The diffraction layer may include first-refractive-index members and second-refractive-index members that are alternately disposed. A refractive index of each of the first-refractive-index members is lower than a refractive index of each of the second-refractive-index members.

In a first viewing angle mode, each of the first set of light emitting structures and the second set of light emitting structures may brighten. In a second viewing angle mode, the first set of light emitting structures may emit light, and the second set of light emitting structures may emit no light.

The display device may include an intermediate layer disposed between the refraction pattern and the diffraction layer and overlapping at least the first region.

The display device may include a material member completely overlapping a face the second region. The material member may have only one refractive index. The refractive index of the material member may be equal to the refractive index of the second-refractive index members. A first face of the diffraction layer may be positioned between the substrate and a second face of the diffraction layer. A first face of the material member may be positioned between the substrate and a second face of the material member and may be positioned not farther from the substrate than the first face of the diffraction layer is. The second face of the material member may be positioned not closer to the substrate than the second face of the diffraction layer is.

The second-refractive-index members and the refraction pattern may be formed of a same material.

The refractive index of each of the second-refractive index members and a refractive index of the refraction pattern may be in a range of 1.5 to 1.8.

The display device may include a first medium layer disposed between the first set of light emitting structures and the diffraction layer. The first medium layer and the first-refractive-index members may be formed of a same material.

The display device may include a second medium layer disposed directly on the refraction pattern. The second medium layer and the first-refractive-index members may be formed of a same material.

A thickness of the diffraction layer in a direction perpendicular to the substrate may be 1 µm or less.

A cross section of each of the second-refractive-index members may have a quadrangle shape.

A pitch of the second-refractive-index members may be in a range of 0.25 µm to 1 µm.

Pitches of the second-refraction-index members may have different values.

The refraction pattern may include a refraction member. A cross section of the refraction member may have a triangle shape.

Widths of two faces of the refraction member may be unequal to each other.

The refraction pattern may include a refraction member. A cross section of the refraction member may have a lenticular shape.

The refraction pattern may include refraction members arranged in parallel. Two of the refraction members may directly contact each other.

An embodiment may be related to a display device. The display device may include the following elements: a first set of light emitting structures; a second set of light emitting structures neighboring the first set of light emitting structures; a diffraction layer disposed on the first set of light emitting structures and not on the second set of light emitting structures; and a refraction pattern disposed on the diffraction layer and refracting light that has passed through the diffraction layer toward a direction that is perpendicular to the diffraction layer.

A first set of discrete members of the diffraction layer and the refraction pattern may be formed of a same material.

The display device may include the following elements: a first medium layer disposed between the first set of light emitting structures and the diffraction layer; and a second medium layer disposed directly on the refraction pattern. Each of a refractive index of the diffraction layer and a refractive index of the refractive pattern may be greater than each of a refractive index of the first medium layer and a refractive index of the second medium layer.

In a first viewing angle mode, each of the first set of light emitting structures and the second set of light emitting structures may brighten. In a second viewing angle mode, the first set of light emitting structures may emit light, and the second set of light emitting structures may emit no light.

The diffraction layer diffracts light emitted by the light emitting structure and having a large incidence angle. The refraction pattern refracts the diffracted light toward the front direction, thereby reducing the viewing angle of the display device.

The diffraction layer and the refraction pattern may be selectively disposed on the first region of the display device and may not be disposed on the second region. In the first viewing angle mode, both the first light emitting structure disposed on the first region and the second light emitting structure disposed on the second region may emit light. In the second viewing angle mode, only the first light emitting structure disposed in the first region may emit light. Advantageously, the user of the display device may control the viewing angle of the display device by selecting one of the first viewing angle mode and the second viewing angle mode. The user may view an image having a wide viewing angle or a narrow viewing angle depending on the environment without a separate device.

BRIEF DESCRIPTION OF THE DRAWINGS

FIG. 5 is a cross-sectional view illustrating a display device according to embodiments.

FIG. 6 is a cross-sectional view illustrating a display device according to embodiments.

FIG. 7 is a cross-sectional view illustrating a display device according to embodiments.

DETAILED DESCRIPTION

Illustrative embodiments are described with reference to the accompanying drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connected" may mean "electrically connected" or "electrically connected through no intervening transistor." The term "insulate" may mean "electrically insulate" or "electrically isolate." The term "conductive" may mean "electrically conductive." The term "include" may mean "be formed of" or "be made of." The term "pattern" may mean "member" or "layer." The term "the same as" may mean "equal to." The term "different" may mean "unequal." The term "drive" may mean "operate" or "control." The term "on" may encompass "directly on" and/or "indirectly on."

Figure 1:
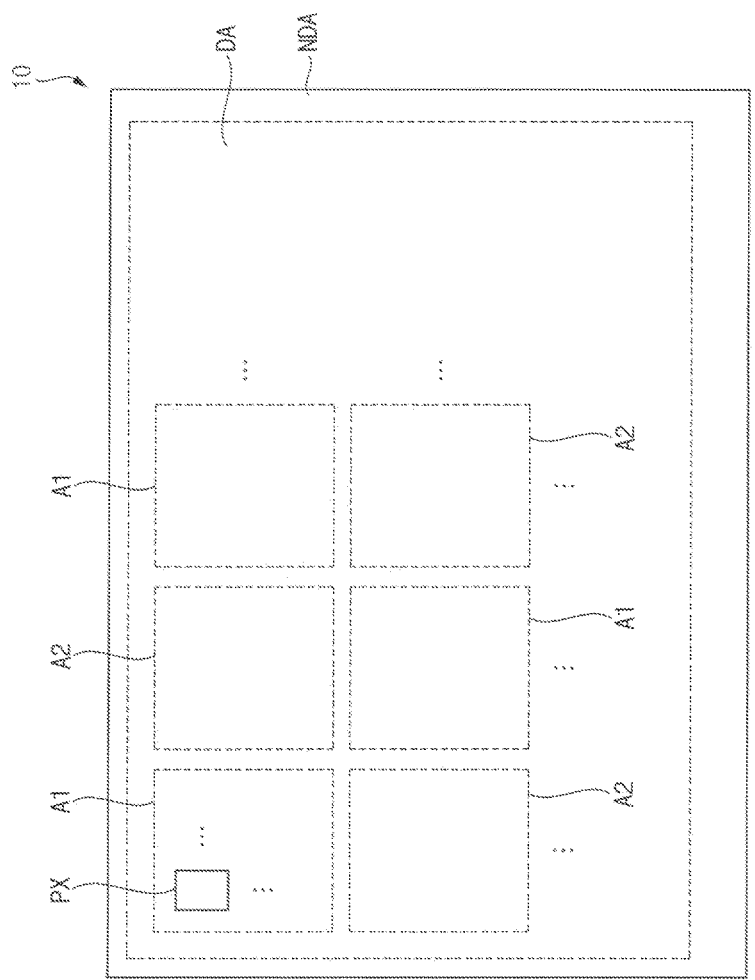
FIG. 1 is a plan view illustrating a display device according to embodiments.

FIG. 1 is a plan view illustrating a display device 10 according to embodiments.

Referring to FIG. 1, the display device 10 may include a display area DA and a non-display area NDA. The display area DA may include pixels PX that are substantially arranged in a matrix form. Each of the pixels PX may display one predetermined basic color. One pixel may be a minimum unit capable of displaying a color independently of other pixels. Each of the pixels PX may display a first color, a second color, or a third color. For example, the first color, the second color, and the third color may be red, green, and blue, respectively.

Each first region A1 of the display device 10 may include a predetermined number of pixels PX, e.g., four pixels PX adjacent to each other. For example, the four pixels may include one red pixel, two green pixels, and one blue pixel. Each second area A2 of the display device 10 may be immediately adjacent to at least one first region A1. A predetermined number of pixels PX, e.g., four pixels PX, adjacent to each other may be disposed in each second region A2. First regions A1 and second regions A2 may be alternately disposed. First regions A1 may be disposed in odd rows, and second regions A2 may be disposed in even rows. First regions A1 may be disposed in odd columns, and second regions A2 may be disposed in even columns. First regions A1 and second regions A2 may be irregularly arranged. A first region A1 and/or a second region A2 may have a rectangular shape in the plan view. A first region A1 and/or a second region A2 may have one or more of various shapes, such as a rhombus.

Figure 2:
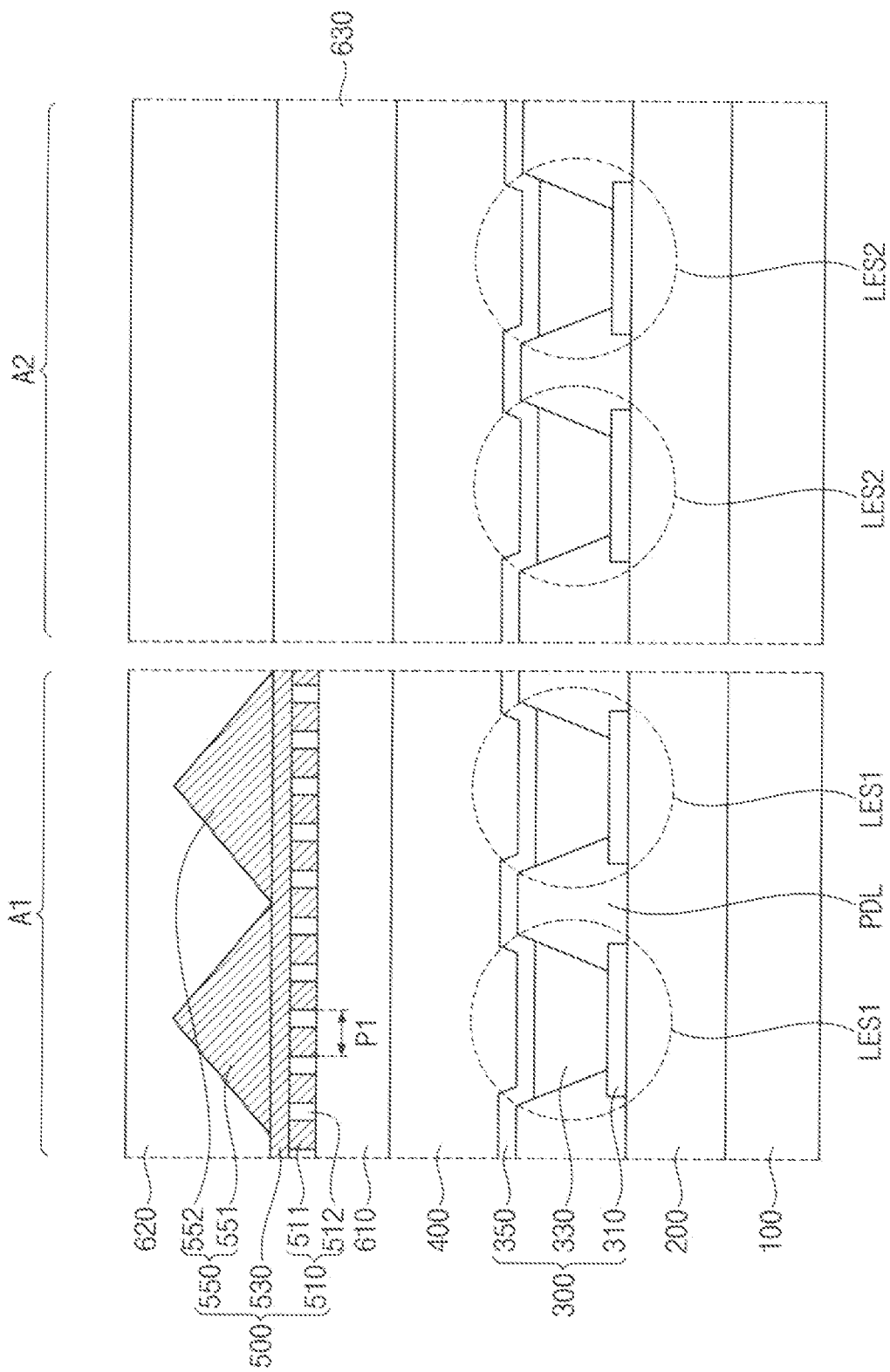
FIG. 2 is a cross-sectional view illustrating the display device of FIG. 1 according to embodiments.

FIG. 2 is a cross-sectional view illustrating the display device 10 of FIG. 1 according to embodiments.

Referring to FIG. 2, the display device 10 may include a substrate 100, a circuit layer 200, light emitting structures 300, a pixel-defining layer PDL, an encapsulation layer 400, a material member 630, a first medium layer 610, a second medium layer 620, and a viewing angle control structure 500.

The substrate 100 may be a glass substrate, a quartz substrate, a plastic substrate, or the like. When the substrate 100 is a plastic substrate, the substrate 100 may be flexible, bendable, or rollable. When the substrate 100 is a plastic substrate, the substrate 100 may include at least one polymer resin; the substrate 100 may include two polymer resin layers and an inorganic material barrier layer disposed between the polymer resin layers. The substrate 100 may have a single layer structure or a multilayer structure. The substrate 100 may include regions A1 and A2 respectively corresponding to the regions A1 and A2 of the display device 10.

The circuit layer 200 may be disposed on the substrate 100. The circuit layer 200 may include at least one transistor and at least one capacitor. The circuit layer 200 may include at least one semiconductor layer, at least one conductive layer, and at least one insulating layer. The circuit layer 200 may provide signals and voltages to the light emitting structures 300.

The pixel defining-layer PDL may be disposed on the circuit layer 200.

The light emitting structures 300 may be disposed on the circuit layer 200. Each of the light emitting structures 300 may include a first electrode 310 electrically connected to the circuit layer 200 and substantially exposed by the pixel-defining layer PDL, a light-emitting part 330 disposed on the exposed portion of the first electrode 310, and a portion of a second electrode 350 disposed on the light-emitting part 330. The first electrode 310 may be an anode electrode, and the second electrode 350 may be a cathode electrode. The light-emitting part 330 may be a single layer or may include functional layers. For example, the light-emitting part 330 may include a hole injection layer, a hole transport layer, an emission layer, an electron transport layer, and an electron injection layer.

The light emitting structures 300 may include a first light emitting structure LES1 disposed in the first region A1 and may include a second light emitting structure LES2 disposed in the second region A2. The first light emitting structure LES1 and the second light emitting structure LES2 may receive different signals and different voltages according to the first region A1 and the second region A2. Accordingly, the first light emitting structure LES1 and the second light emitting structure LES2 may emit light independently. Accordingly, a first viewing angle mode MOD1 and a second viewing angle mode MOD2 may be enabled.

The encapsulation layer 400 may be disposed on the light emitting structures 300. The encapsulation layer 400 may include at least one inorganic layer (for blocking moisture and oxygen) and at least one organic layer (for providing desirably mechanical properties). For example, the encapsulation layer 400 may include a first inorganic layer, an organic layer disposed on the first inorganic layer, and a second inorganic layer disposed on the organic layer.

The first medium layer 610 may overlap the first region A1 of the substrate 100 and may be disposed on the encapsulation layer 400. The first medium layer 610 may not overlap the second region A2 of the substrate 100 in a direction perpendicular to the substrate 100. The first medium layer 610 may be disposed in the first region A1 of the display device 10 and may not be disposed in the second region A2 of the display device 10. A refractive index of the first medium layer 610 may be about 1.5 or less. The first medium layer 610 may include acrylate. The refractive index of the first medium layer 610 may be less than one or more of a refractive index of a diffraction layer 510, a refractive index of an intermediate layer 530, and a refractive index of a refractive pattern 550.

The viewing angle control structure 500 may be disposed on the first medium layer 610. The viewing angle control structure 500 may overlap with the first region A1 of the substrate 100 and may not overlap with the second region A2 of the substrate 100 in a direction perpendicular to the substrate 100. The viewing angle control structure 500 may be disposed in the first region A1 of the display device 10 and may not be disposed in the second region A2 of the display device 10. The viewing angle control structure may include the diffraction layer 510, the intermediate layer 530, and the refraction pattern 550.

The diffraction layer 510 may include a plurality of high refractive index patterns/members 511 and a plurality of low refractive index patterns/members 512. The high refractive index patterns 511 and the low refractive index patterns 512 may be alternately disposed. The diffraction layer 510 may change a path of light received from the first light emitting structure LES1 through diffraction.

A refractive index of each of the high refractive index patterns 511 may be greater than a refractive index of each of the low refractive index patterns 512. The refractive index of each of the high refractive index patterns 511 may be in a range of about 1.5 to about 1.8, and the refractive index of each of the low refractive index patterns 512 may be about 1.5 or less. The high refractive index patterns 511 may include polyethylene naphthalate. The low refractive index patterns 512 may include acrylate. The first medium layer 610 and the low refractive index patterns 512 may include the same material. The first medium layer 610 and the low refractive index patterns 512 may have substantially the same refractive index. The high refractive index patterns 511 and the low refractive index patterns 512 may not significantly block light.

A thickness of the high refractive index patterns 511 in a direction perpendicular to the substrate 100 may be about 1 µm or less. A pitch P1 of the high refractive index patterns 511 may be substantially constant. A width of each of the high refractive index patterns 511 may be substantially constant. A width of each of the low refractive index patterns 512 may be substantially constant. The pitch P1 of the high refractive index patterns 511 may be in a range of about 0.25 µm to about 1 µm. The pitch P1 of the high refractive index patterns 511 may be in a range of about 0.5 µml (or 500 nm) to about 0.8 µml (or 800 nm). A wavelength of visible light is about 400 nm to about 700 nm. A value obtained by dividing the wavelength of visible light by the pitch P1 of the high refractive index patterns 511 may be in a range of about 0.75 to about 1.5. Accordingly, the diffraction layer 510 may effectively direct a path of light received from the first light emitting structure LES1 to a front direction DF (shown in FIG. 3) through diffraction. The front direction DF is perpendicular to the substrate 100.

A cross section of each of the high refractive index patterns 511 may have a quadrangle shape. The cross section of each of the high refractive index patterns 511 may have one or more of various shapes.

The intermediate layer 530 may be disposed on the diffraction layer 510. A refractive index of the intermediate layer 530 may be the same as a refractive index of the high refractive index patterns 511. The refractive index of the intermediate layer 530 may be in a range of about 1.5 to about 1.8. The intermediate layer 530 and the high refractive index patterns 511 may include the same material. The intermediate layer 530 and the high refractive index patterns 511 may be directly connected to each other. The intermediate layer 530 may include polyethylene naphthalate. The refractive index of the intermediate layer 530 may be greater than the refractive index of the low refractive index patterns 512. The diffraction layer 510 and the refraction patterns 550 may overlap the first region A1 of the substrate 100 and may not overlap the second region A2 of the substrate 100. The intermediate layer 530 may or may not overlap the second region A2. The portion of the intermediate layer 530 overlapping the second region A2 may be substantially flat. Light emitted from the second light emitting structure LES2 may be insignificantly refracted at an entry interface of the intermediate layer 530 and may be insignificantly refracted at an exit interface of the intermediate later 530. A viewing angle of light emitted by the second light emitting structure LES2 may not be substantially changed. A thickness of the intermediate layer 530 may be configured according to embodiments.

The refraction pattern 550 may be disposed on the intermediate layer 530. The refraction pattern/layer 550 may overlap the diffraction layer 510. The refraction pattern 550 may include refraction parts/members 551 and 552 arranged in parallel. The refraction parts 551 and 552 may contact each other. A refractive index of the refraction pattern 550 may be the same as a refractive index of the high refractive index patterns 511. The refractive index of the refraction pattern 550 may be in a range of about 1.5 to about 1.8. The refraction pattern 550 and the high refractive index patterns 511 may include the same material. The refractive index of the refraction pattern 550 may be greater than the refractive index of the low refractive index patterns 512. The refraction pattern 550, the intermediate layer 530, and the high refractive index patterns 511 may include the same material. For example, the refraction pattern 550, the intermediate layer 530, and the high refractive index patterns 511 may all include polyethylene naphthalate. The refraction pattern 550 may change a path of light received from the diffraction layer 510 through refraction.

Cross sections of the refraction parts 551 and 552 may have triangle shapes/structures. For example, the cross section of each of the refraction parts 551 and 552 may have an isosceles triangle shape. The cross sections of the refraction parts 551 and 552 may have one or more of various shapes. Thicknesses of the refraction parts 551 and 552 and widths of the refraction parts 551 and 552 may be configured according to embodiments. Each of the refraction parts 551 and 552 may overlap about 5 or about 6 the high refractive index patterns 511.

The second medium layer 620 may be disposed on the viewing angle control structure 500 in the first region A1 of the display device 10, and may be disposed on the encapsulation layer 400 in the second region A2 of the display device 10. The second medium layer 620 may overlap both the first region A1 and the second region A2 of the substrate 100. The second medium layer 620 may overlap the first region A1 but not the second region A2 of the substrate 100. A refractive index of the second medium layer 620 may be about 1.5 or less. The refractive index of the second medium layer 620 may be less than the refractive index of the viewing angle control structure 500. The refractive index of the second medium layer 620 and the refractive index of the first medium layer 610 may be the same. The second medium layer 620 and the first medium layer 610 may include the same material. The second medium layer 620 may include acrylate. Each of the first medium layer 610, the low refractive index patterns 512, and the second medium layer 620 may include acrylate. Each of the high refractive index patterns 511, the intermediate layer 530, and the refraction pattern 550 may include polyethylene naphthalate.

The material member 630 may completely overlap a top/bottom face of the second region A2 of the substrate 100 and may have only one refractive index. The bottom face of the material member 630 may not be positioned farther from the substrate 100 than the bottom face of the diffraction layer 510 is. The top face of the material member 630 may not be positioned closer to the substrate 100 than the top face of the diffraction layer 510 is. The refractive index of the material member 630 may be lower than the refractive index of the high refractive index patterns 511 and may be equal to the refractive index of the first medium layer 610, the low refractive index patterns 512, and the second medium layer 620. The material member may include acrylate.

Figure 3:
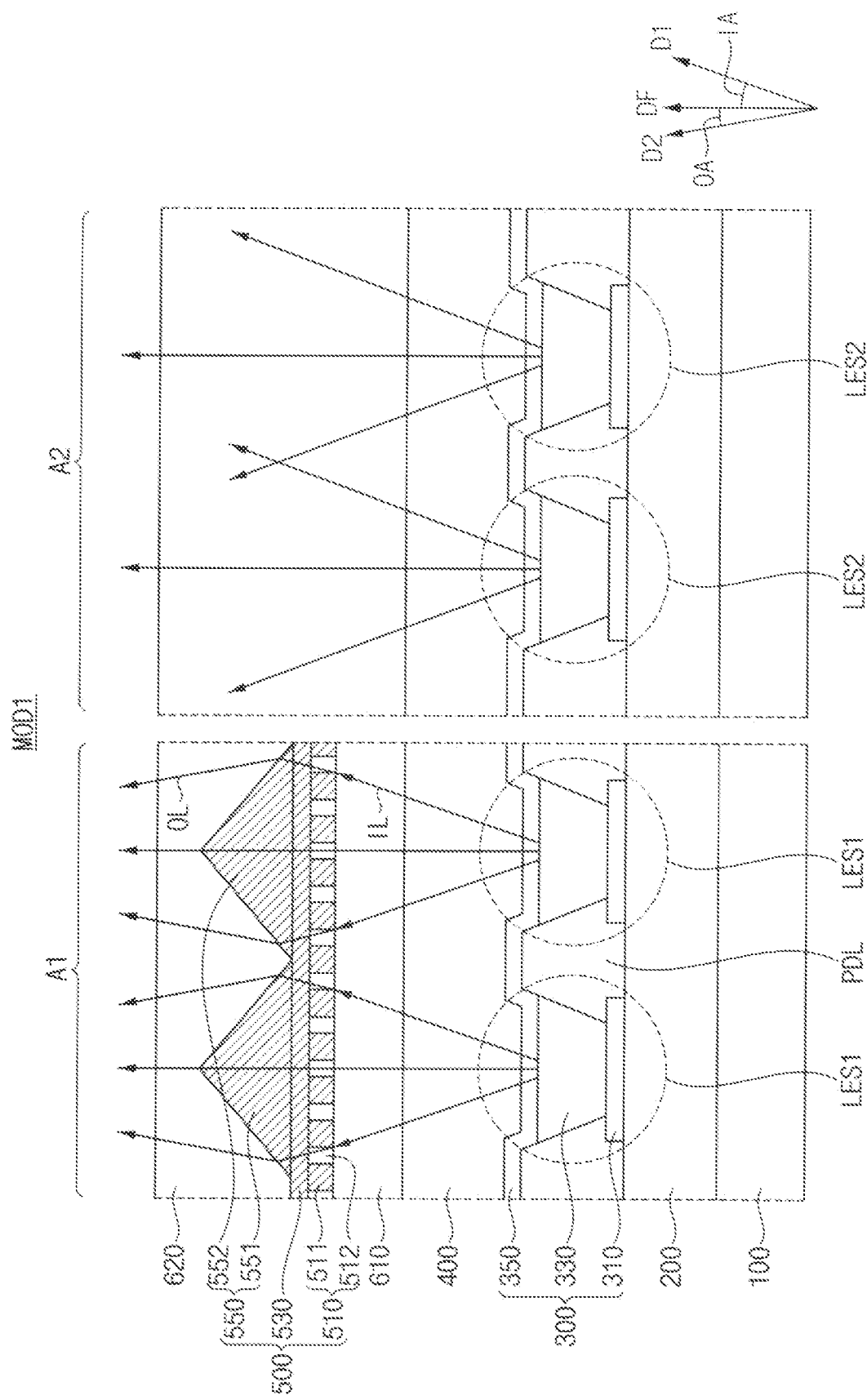
FIG. 3 is a diagram for describing the display device of FIG. 2 in a first viewing angle mode according to embodiments.

The display device 10 includes the viewing angle control structure 500 selectively disposed on the first region A1, so that an emission angle of light emitted from the first light emitting structure LES1 may be reduced with reference to the front direction DF (shown in FIG. 3). A path of light emitted by the first light emitting structure LES1 may be adjusted toward/to the front direction DF rather than a side direction.

FIG. 3 is a diagram for describing the display device of FIG. 2 in a first viewing angle mode according to embodiments. The first viewing angle mode MOD1 may be a wide viewing angle mode.

Referring to FIG. 3, both the first light emitting structure LES1 disposed in the first region A1 of the display device and the second light emitting structure LES2 disposed in the second region A2 of the display device may emit light in the first viewing angle mode MOD1.

Light emitted from the first light emitting structure LES1 and input to the viewing angle control structure 500 may be called incident light IL. The light resulted from the incident light IL and outputted from the viewing angle control structure 500 may be called outgoing light OL. An acute angle formed by a direction D1 of the incident light IL and the front direction DF may be called an incident angle IA. An acute angle formed by a direction D2 of the outgoing light OL and the front direction DF may be called the emission angle.

When the pitch P1 of the high refractive index patterns 511 is about 0.8 μm, due to the viewing angle control structure 500, an incident light IL having the incident angle IA of about 20° may be changed to an outgoing light OL having an emission angle OA of about 9°. An incident light IL having the incident angle IA of about 30° may be changed to an outgoing light OL having the emission angle OA of about 25°. The emission angle OA may be smaller than the incident angle IA. Accordingly, an image displayed in the first region A1 may provide a narrow viewing angle to a user of the display device 10.

Since a path of light emitted by the second light emitting structure LES2 is not substantially changed, the image displayed in the second region A2 may provide a wide viewing angle to the user of the display device 10.

The first viewing angle mode MOD1 may be a normal mode, and in the first viewing angle mode MOD1, both the first light emitting structure LES1 and the second light emitting structure LES2 may display colors.

Accordingly, in the first viewing angle mode MOD1, the display device 10 may provide an image with a relatively wide viewing angle. In the first viewing angle mode MOD1, a user of the display device 10 may view an image provided by the display device 10 not only from the front of the display device 10 but also when not overlapping the display device 10.

Figure 4:
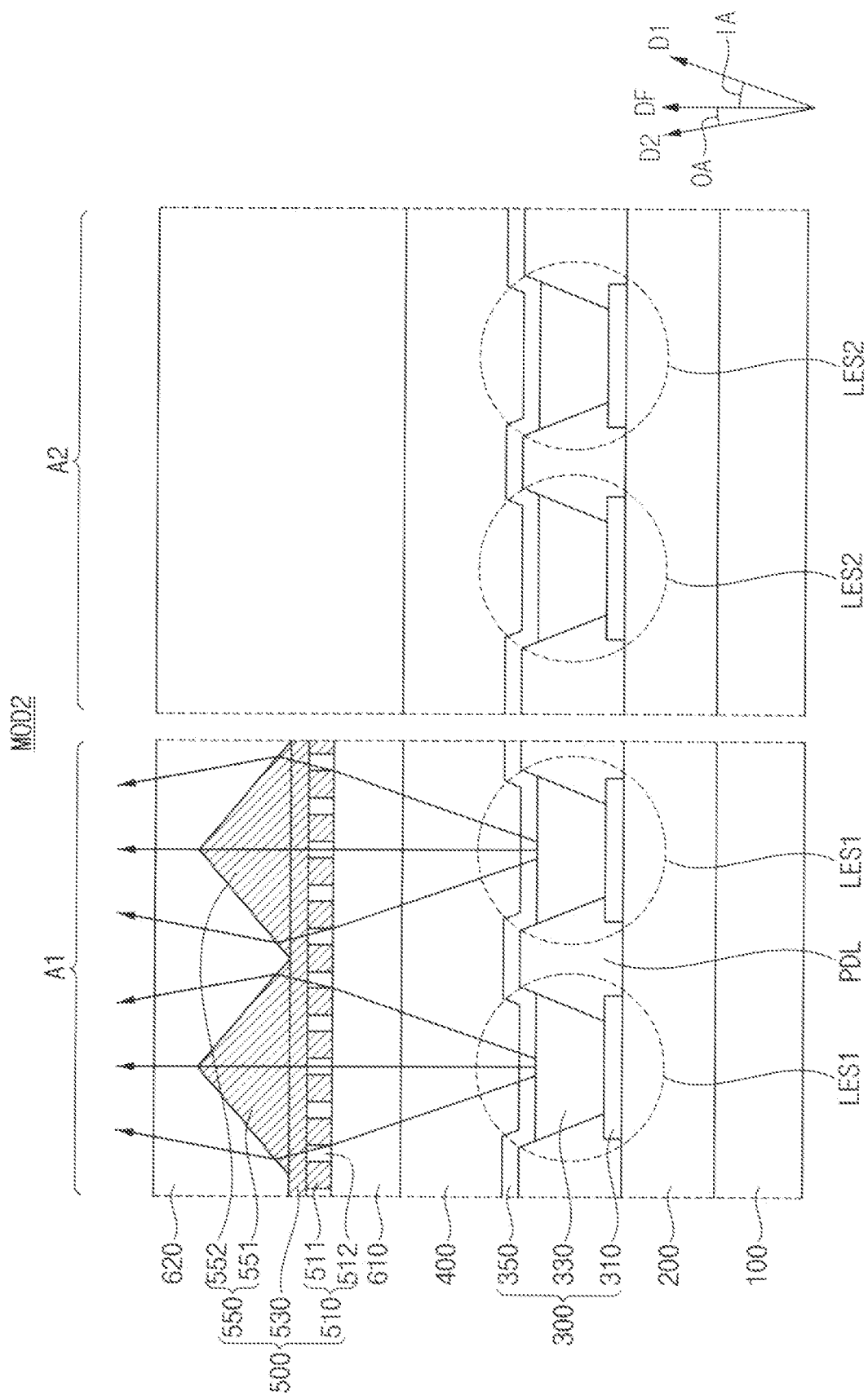
FIG. 4 is a diagram for describing the display device of FIG. 2 in a second viewing angle mode according to embodiments.

FIG. 4 is a diagram for describing the display device of FIG. 2 in a second viewing angle mode according to embodiments. The second viewing angle mode MOD2 may be a narrow viewing angle mode.

Referring to FIG. 4, the first light emitting structure LES1 (disposed in the first region A1 of the display device 10) may emit light in the second viewing angle mode MOD2.

Light emitted from the first light emitting structure LES1 and inputted to the viewing angle control structure 500 may be called incident light IL. The light resulted from the incident light IL and outputted from the viewing angle control structure 500 may be called outgoing light OL. An acute angle formed by a direction D1 of the incident light IL and the front direction DF may be called an incident angle IA. An acute angle formed by a direction D2 of the outgoing light OL and the front direction DF may be called the emission angle.

When the pitch P1 of the high refractive index patterns 511 is about 0.8 μm, due to the viewing angle control structure 500, an incident light having the incident angle IA of about 20° may be changed to an outgoing light OL having an emission angle OA of about 9°. An incident light IL having the incident angle IA of about 30° may be changed to an outgoing light OL having the emission angle OA of about 25°. The emission angle OA may be smaller than the incident angle IA. Accordingly, an image displayed in the first region A1 may provide a narrow viewing angle to a user of the display device 10.

In the second viewing angle mode MOD2, only the first light emitting structure LES1 disposed in the first region A1 may emit light. The second light emitting structure LES2 may not emit light.

The second viewing angle mode MOD2 may be a private mode. In the second viewing angle mode MOD2, only the first light emitting structure LES1 may display colors; the second light emitting structure LES2 may not display colors. Accordingly, in the second viewing angle mode MOD2, the display device 10 may provide an image with a relatively narrow viewing angle. In the second viewing angle mode MOD2, a user of the display device 10 may view an image provided by the display device 10 from the front of the display device 10. In the second viewing angle mode MOD2, the user of the display device 10 may not clearly see an image provided by the display device 10 when the user does not overlap the display device 10 and does not view the image in the front direction DF.

Referring to FIGS. 3 and 4, the display device 10 may be selectively driven in one of the first viewing angle mode MOD1 and the second viewing angle mode MOD2. The user of the display device 10 may actively adjust the viewing angle according to the environment. For example, when being near no other persons, or when viewing an image that can be viewed by others, the user of the display device 10 may select the first viewing angle mode MOD1 to view the image at a wide viewing angle. When there is another person around, or when viewing an image that should not be viewed by others, the user of the display device 10 may select the second viewing angle mode MOD2 to view the image at a narrow viewing angle.

FIG. 5 is a cross-sectional view illustrating a display device 10 according to embodiments.

Referring to FIG. 5, lengths/widths of two (non-hypotenuse) sides/faces S1 and S1 of a refraction part 551/552 that are not parallel to the substrate 100 and/or to the layer 530 may be different. Lengths/widths of two sides/faces of a refraction part 551/552 at boundaries between the refraction pattern 550 and the second medium layer 620 may be different. Accordingly, among the light passing through the diffraction layer 510, an emission angle of an outgoing light that is outputted from the first side/face S1 may be different from an emission angle of an outgoing light that is outputted from the second side/face S2. The outgoing light that outputted from the first side/face S1 and the outgoing light that is outputted from the second side/face S2 may still be directed toward the front direction DF. The user may watch the image in the front direction DF, but may not clearly see the image when not viewing the image in the front direction DF. Although the lengths/widths of the two sides/faces S1 and S2 of the refraction pattern 550 are different, because of at least the diffraction performed by the diffraction layer 510 and the refraction performed by the refraction pattern 550, the display device 10 may provide a narrow viewing angle. In the second viewing angle mode MOD2, nearby people who do not overlap the display device 10 and do not view the image in the front direction DF cannot clearly see the image.

FIG. 6 is a cross-sectional view illustrating a display device 10 according to embodiments.

Referring to FIG. 6, a cross section of the refraction pattern 550 may have a convex lenticular shape. The lenticular shape may be substantially semi-circular or semi-elliptical. Outgoing lights exiting the refraction pattern 550 be directed toward the front direction in many different angles. In the second mode MOD2, a user viewing the image displayed by the display device 10 in the front direction DF may smoothly recognize the image, and people not viewing the image in the front direction DF may not clearly see the image.

FIG. 7 is a cross-sectional view illustrating a display device 10 according to embodiments.

Referring to FIG. 7, pitches P1, P2, and P3 of the high refraction index patterns 511 may have different values. For this reason, the degrees to which the diffraction layer 510 diffracts light may vary, such that outgoing lights having different degrees of diffraction may overlap each other. In the second viewing angle mode MOD2, a user viewing an image displayed by the display device 10 in the front direction DF can smoothly recognize the image, and people not viewing the image in the front direction DF may not clearly see the image.

Although illustrative embodiments have been described, various embodiments, arrangements, and modifications are practical. Practical embodiments are within the scope of the appended claims.

What is claimed is:

1. A display device comprising:
   a substrate including a first region and a second region;
   a first set of light emitting structures overlapping the first region;
   a second set of light emitting structures overlapping the second region;
   a diffraction layer overlapping the first region without overlapping the second region; and
   a refraction pattern overlapping the diffraction layer,
   wherein the diffraction layer includes first-refractive-index members and second-refractive-index members that are alternately disposed,
   wherein a refractive index of each of the first-refractive-index members is lower than a refractive index of each of the second-refractive-index members,
   wherein in a first viewing angle mode, each of the first set of light emitting structures and the second set of light emitting structures brightens, and
   wherein in a second viewing angle mode, the first set of light emitting structures emits light, and the second set of light emitting structures emits no light.

2. The display device of claim 1, further comprising an intermediate layer disposed between the refraction pattern and the diffraction layer and overlapping at least the first region.

3. The display device of claim 1, further comprising a material member completely overlapping a face the second region,
   wherein the material member has only one refractive index,
   wherein the refractive index of the material member is equal to the refractive index of the second-refractive index members,
   wherein a first face of the diffraction layer is positioned between the substrate and a second face of the diffraction layer,
   wherein a first face of the material member is positioned between the substrate and a second face of the material member and is positioned not farther from the substrate than the first face of the diffraction layer is, and wherein the second face of the material member is positioned not closer to the substrate than the second face of the diffraction layer is.

4. The display device of claim 1, wherein the second-refractive-index members and the refraction pattern are formed of a same material.

5. The display device of claim 1, wherein the refractive index of each of the second-refractive index members and a refractive index of the refraction pattern are in a range of 1.5 to 1.8.

6. The display device of claim 1, further comprising a first medium layer disposed between the first set of light emitting structures and the diffraction layer,
wherein the first medium layer and the first-refractive-index members are formed of a same material.

7. The display device of claim 1, further comprising a second medium layer disposed directly on the refraction pattern,
wherein the second medium layer and the first-refractive-index members are formed of a same material.

8. The display device of claim 1, wherein a thickness of the diffraction layer in a direction perpendicular to the substrate is 1 μm or less.

9. The display device of claim 1, wherein a cross section of each of the second-refractive-index members has a quadrangle shape.

10. The display device of claim 1, wherein a pitch of the second-refractive-index members is in a range of 0.25 μm to 1 μm.

11. The display device of claim 1, wherein pitches of the second-refractive-index members have different values.

12. The display device of claim 1, wherein the refraction pattern comprises a refraction member, and wherein a cross section of the refraction member has a triangle shape.

13. The display device of claim 12, wherein widths of two faces of the refraction member are unequal to each other.

14. The display device of claim 1, wherein the refraction pattern comprises a refraction member, and wherein a cross section of the refraction member has a lenticular shape.

15. The display device of claim 1, wherein the refraction pattern includes refraction members arranged in parallel, and
wherein two of the refraction members directly contact each other.

16. A display device comprising:
a first set of light emitting structures;
a second set of light emitting structures neighboring the first set of light emitting structures;
a diffraction layer disposed on the first set of light emitting structures and not on the second set of light emitting structures; and
a refraction pattern disposed on the diffraction layer and refracting light that has passed through the diffraction layer toward a direction that is perpendicular to the diffraction layer,
wherein in a first viewing angle mode, each of the first set of light emitting structures and the second set of light emitting structures brightens, and
wherein in a second viewing angle mode, the first set of light emitting structures emits light, and the second set of light emitting structures emits no light.

17. The display device of claim 16, wherein a first set of discrete members of the diffraction layer and the refraction pattern are formed of a same material.

18. The display device of claim 16, further comprising:
a first medium layer disposed between the first set of light emitting structures and the diffraction layer; and
a second medium layer disposed directly on the refraction pattern,
wherein each of a refractive index of the diffraction layer and a refractive index of the refractive pattern is greater than each of a refractive index of the first medium layer and a refractive index of the second medium layer.

* * * * *